United States Patent
Ha et al.

(10) Patent No.: US 10,845,489 B2
(45) Date of Patent: Nov. 24, 2020

(54) METHOD OF COMPRESSING GPS DATA, METHOD OF RESTORING GPS DATA, AND GPS DEVICE

(71) Applicant: PostEpi Co., ltd., Seoul (KR)

(72) Inventors: Ji Chul Ha, Goyang-si (KR); Sang Yoon Yoon, Seoul (KR)

(73) Assignee: PostEpi Co., LTD (KR)

( * ) Notice: Subject to any disclaimer, the term of this patent is extended or adjusted under 35 U.S.C. 154(b) by 238 days.

(21) Appl. No.: 16/165,715

(22) Filed: Oct. 19, 2018

(65) Prior Publication Data

US 2019/0162860 A1    May 30, 2019

(30) Foreign Application Priority Data

Nov. 27, 2017 (KR) .................. 10-2017-0159613

(51) Int. Cl.

| G01S 19/37 | (2010.01) |
|---|---|
| H03M 7/30 | (2006.01) |
| H04L 29/06 | (2006.01) |
| H03M 7/24 | (2006.01) |
| G01S 19/09 | (2010.01) |
| G01S 19/24 | (2010.01) |

(52) U.S. Cl.
CPC ............. *G01S 19/37* (2013.01); *G01S 19/09* (2013.01); *G01S 19/24* (2013.01); *H03M 7/24* (2013.01); *H03M 7/30* (2013.01); *H03M 7/70* (2013.01); *H04L 69/04* (2013.01); *H04L 67/42* (2013.01)

(58) Field of Classification Search
CPC .......... G01S 19/37; G01S 19/09; G01S 19/24; G01S 19/29; G01S 19/30; G01S 19/34; H03M 7/24; H03M 7/30; H03M 7/70; H04L 69/04

USPC ..................................................... 342/357.77
See application file for complete search history.

(56) References Cited

U.S. PATENT DOCUMENTS

| 2005/0174286 A1* | 8/2005 | Lokshin | ................ | G01S 19/258 |
| | | | | 342/357.28 |
| 2007/0001898 A1* | 1/2007 | Twitchell, Jr. | .......... | G01S 19/20 |
| | | | | 342/357.4 |
| 2013/0141276 A1* | 6/2013 | Artushkin | ................ | G01S 19/33 |
| | | | | 342/357.24 |
| 2016/0084961 A1* | 3/2016 | Morishita | ........... | G01M 5/0066 |
| | | | | 342/357.52 |

* cited by examiner

*Primary Examiner* — Harry K Liu
(74) *Attorney, Agent, or Firm* — McDonnell Boehnen Hulbert & Berghoff LLP

(57) ABSTRACT

A method of compressing global positioning system (GPS) data, a method of restoring the GPS data, and a GPS device are provided. The method of compressing GPS data includes receiving, by a GPS device mounted in a moving object, coordinate values related to source data of GPS information at a sampling rate in accordance with a communication environment in which the GPS device communicates with an external device with a predetermined band; allocating a data capacity that matches a maximum value of displacement according to a difference which can occur between coordinate values of the moving object; calculating a displacement value between corresponding coordinate values at each time interval of the sampling rate; and generating displacement data by encoding each displacement value according to the data capacity and storing the displacement data in a predetermined device.

10 Claims, 7 Drawing Sheets

[FIG. 1]
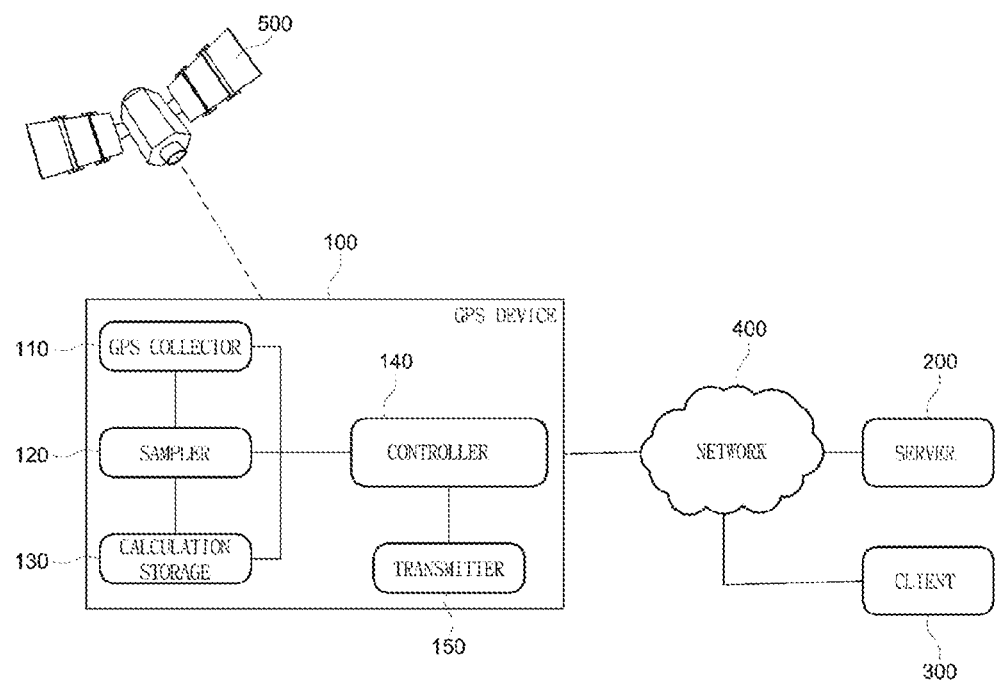
[FIG. 2]
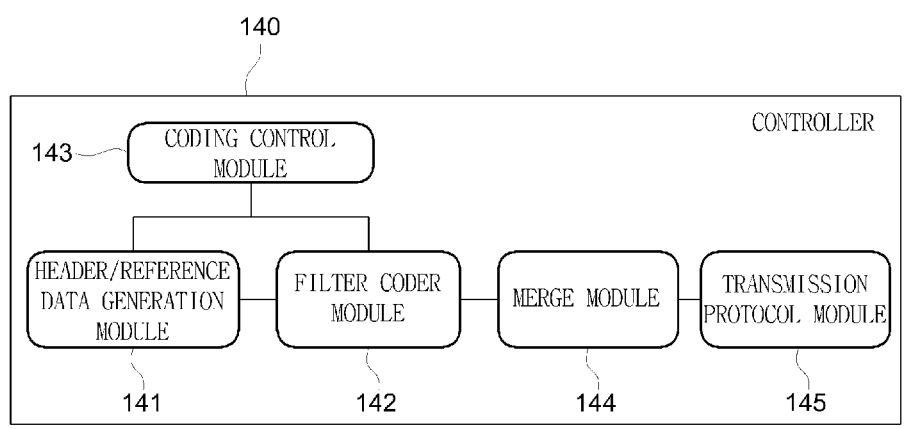

[FIG. 3]
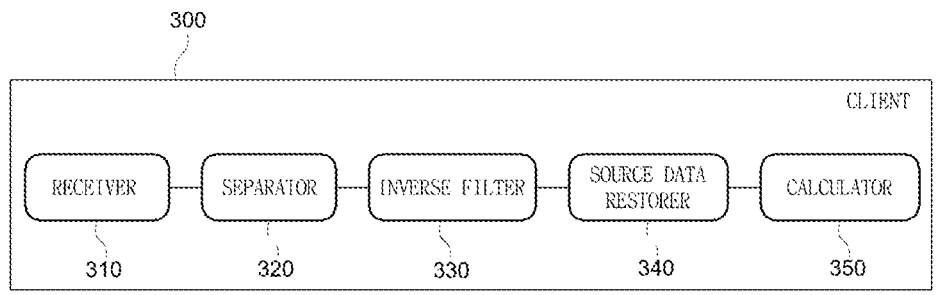
[FIG. 4]
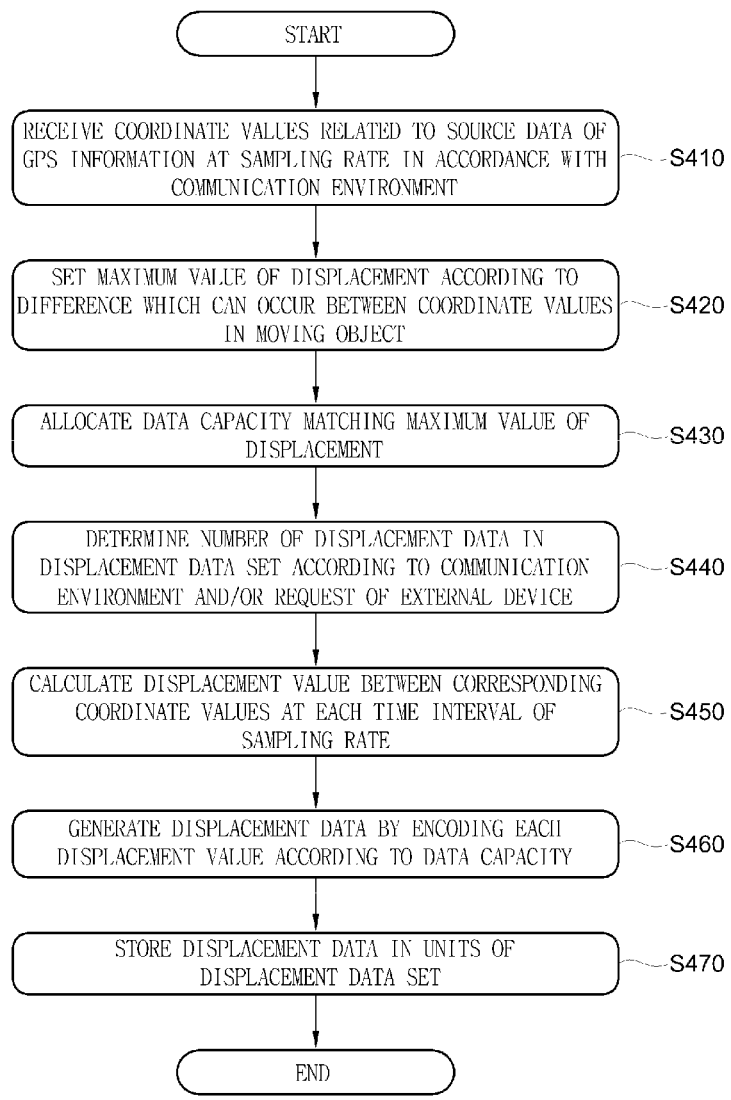

[FIG. 5]

| MEASUREMENT TIME | LATITUDE | LONGITUDE |
|---|---|---|
| 2017-09-23 1:45:00 | 37.264064 | 126.889747 |
| 2017-09-23 1:45:01 | 37.263905 | 126.889619 |
| 2017-09-23 1:45:02 | 37.263905 | 126.889619 |
| 2017-09-23 1:45:03 | 37.263905 | 126.889619 |
| 2017-09-23 1:45:04 | 37.263905 | 126.889619 |
| 2017-09-23 1:45:05 | 37.263746 | 126.889491 |
| 2017-09-23 1:45:06 | 37.263587 | 126.889363 |
| 2017-09-23 1:45:07 | 37.263428 | 126.889235 |
| 2017-09-23 1:45:08 | 37.263428 | 126.889235 |
| 2017-09-23 1:45:09 | 37.263428 | 126.889235 |
| 2017-09-23 1:45:10 | 37.263266 | 126.889103 |
| 2017-09-23 1:45:11 | 37.263104 | 126.888971 |
| 2017-09-23 1:45:12 | 37.262942 | 126.888839 |

⋮

[FIG. 6]
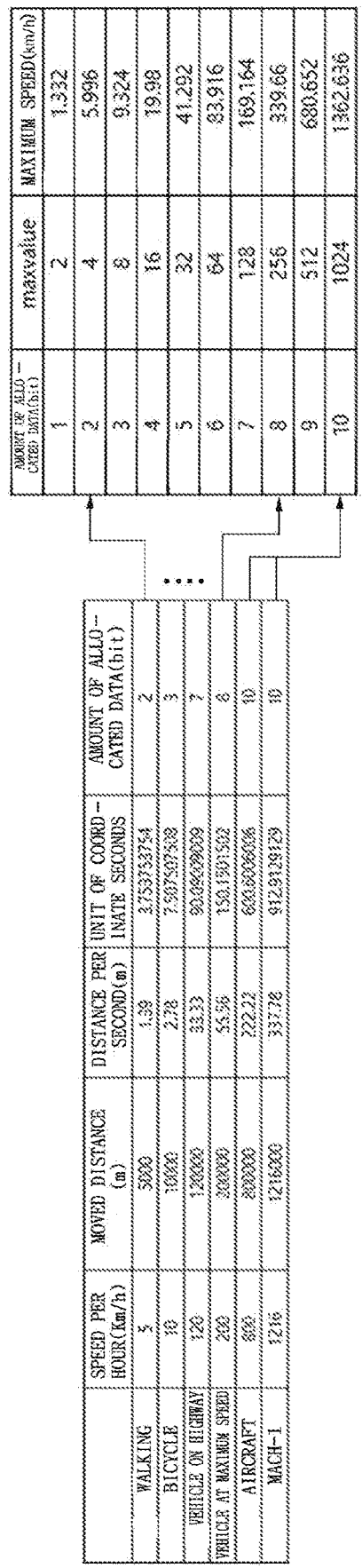

[FIG. 7]

| MEASUREMENT TIME | LATITUDE | LONGITUDE | LATITUDE DISPLACEMENT | LONGITUDE DISPLACEMENT | LATITUDE DISPLACEMENT(hex) | LONGITUDE DISPLACEMENT(hex) | LATITUDE DISPLACEMENT (signbit) | LONGITUDE DISPLACEMENT (signbit) |
|---|---|---|---|---|---|---|---|---|
| 2017-09-23 14:45:00 | 37.264064 | 126.889747 | | | | | | |
| 2017-09-23 14:45:01 | 37.263905 | 126.889619 | 159 | 128 | 9F | 80 | 0010011111 | 0010000000 |
| 2017-09-23 14:45:02 | 37.263905 | 126.889619 | 0 | 0 | 0 | 0 | 0000000000 | 0000000000 |
| 2017-09-23 14:45:03 | 37.263905 | 126.889619 | 0 | 0 | 0 | 0 | 0000000000 | 0000000000 |
| 2017-09-23 14:45:04 | 37.263905 | 126.889619 | 0 | 0 | 0 | 0 | 0000000000 | 0000000000 |
| 2017-09-23 14:45:05 | 37.263746 | 126.889491 | 159 | 128 | 9F | 80 | 0010011111 | 0010000000 |
| 2017-09-23 14:45:06 | 37.263587 | 126.889363 | 159 | 128 | 9F | 80 | 0010011111 | 0010000000 |
| 2017-09-23 14:45:07 | 37.263428 | 126.889235 | 159 | 128 | 9F | 80 | 0010011111 | 0010000000 |
| 2017-09-23 14:45:08 | 37.263428 | 126.889235 | 0 | 0 | 0 | 0 | 0000000000 | 0000000000 |
| 2017-09-23 14:45:09 | 37.263428 | 126.889235 | 0 | 0 | 0 | 0 | 0000000000 | 0000000000 |
| 2017-09-23 14:45:10 | 37.263266 | 126.889103 | 162 | 132 | A2 | 84 | 0010100010 | 0010000100 |
| 2017-09-23 14:45:11 | 37.263104 | 126.888971 | 162 | 132 | A2 | 84 | 0010100010 | 0010000100 |
| 2017-09-23 14:45:12 | 37.262942 | 126.888839 | 162 | 132 | A2 | 84 | 0010100010 | 0010000100 |

. . . .

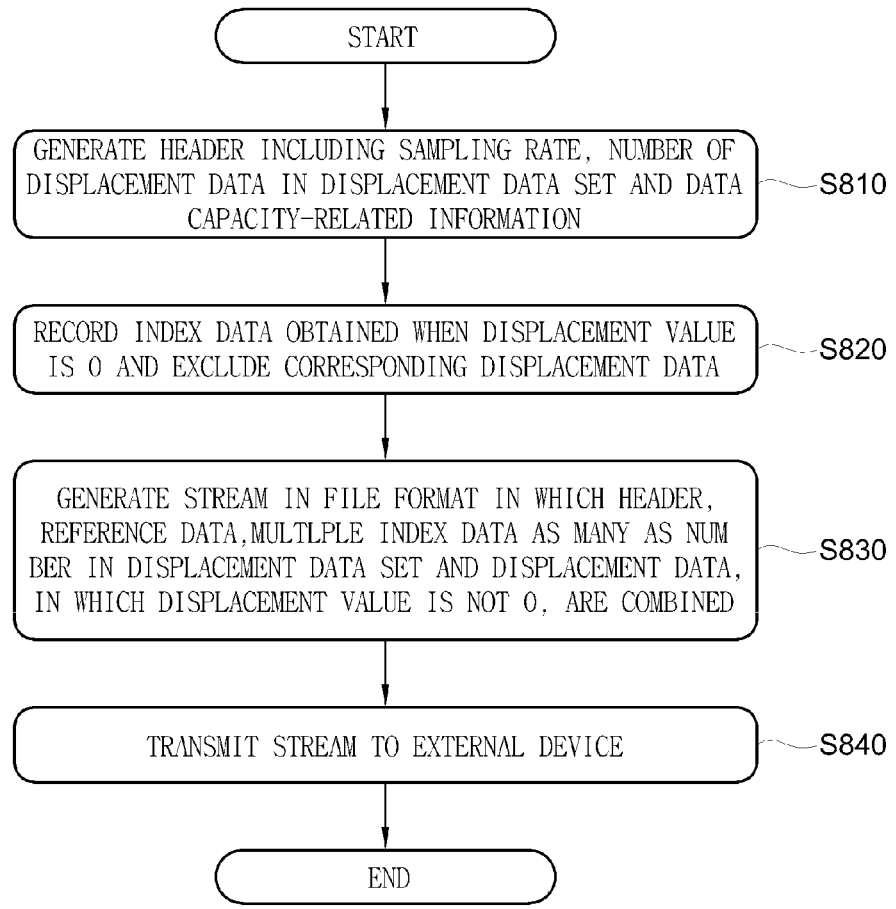

[FIG. 10]
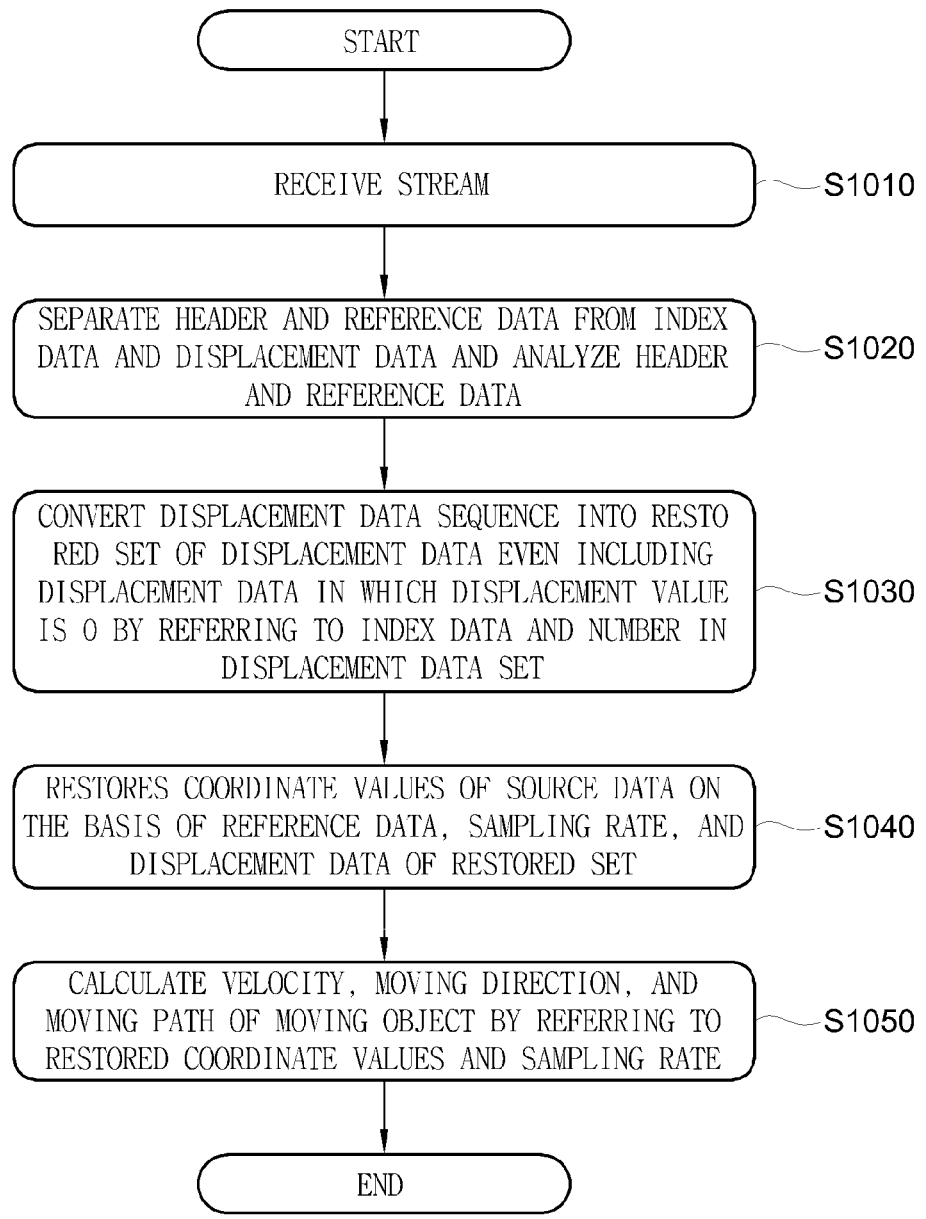

METHOD OF COMPRESSING GPS DATA, METHOD OF RESTORING GPS DATA, AND GPS DEVICE

CROSS-REFERENCE TO RELATED APPLICATION

This application claims priority to and the benefit of Korean Patent Application No. 2017-159613, filed on Nov. 27, 2017, the disclosure of which is incorporated herein by reference in its entirety.

BACKGROUND

1. Field of the Invention

The present invention relates to a method of compressing global positioning system (GPS) data, a method of restoring GPS data, and a GPS device, and more specifically, to a method of compressing GPS data which allows a large amount of GPS data compressed as a small amount of data using a lossless GPS data compression method to be efficiently transmitted simultaneously to an external device even in a communication environment of a narrowband network, and also reducing memory burden when the data is stored.

2. Discussion of Related Art

A global positioning system (GPS) is a position measurement system that receives radio waves emitted from satellites and confirms a current position of the system.

Generally, a radio communication terminal equipped with a GPS satellite signal receiver is carried or mounted in a moving object, such as a walking human, a vehicle, a ship, an aircraft, and the like. The radio communication terminal receives current position information from GPS satellites and transmits the position information to a GPS server of a radio communication provider. In addition, the GPS server may provide a location-based service or transmit the position information to a client which performs analysis for tracking a path of the moving object.

Such position information is generally represented according to a GPS data format, for example, National Marine Electronics Association (NMEA)-0183 format. Specifically, the GPS data format includes a reception time, a latitude coordinate value, a longitude coordinate value, and other pieces of data. An example of American standard code for information interchange (ASCII) representation of one piece of position information indicating a reception time and latitude and longitude coordinate values is "2017-09-23 01:45:00, 37.264064, 126.889747" and, when it is represented by eliminating commas (,) used as data delimiters, delimiters (-), and spaces, 31 bytes are required, such as in "20170923014500372640641268897477."

When the position information is converted into hexadecimal (HEX) data for efficient implementation of a transmission bit rate of position information transmitted to the server or the like, the above example of position information is represented by at least 12 bytes.

Meanwhile, a wideband communication environment may be used to transmit the position information to a server or a client. However, in recent years, a narrowband communication environment has been emerging due to the use of a radio communication terminal of a moving object to which the Internet of Things (IoT) is applied. Examples of networks applying to the IoT may include a long range (LoRa) network, narrowband Internet of Things (NB IoT), and the like. Such networks have smaller bandwidths than a long term evolution (LTE) network and have a much smaller occupying capacity that can be allocated to valid data.

As described above, since one piece of position information occupies a large amount of data, when pieces of GPS data, which are position information, is transmitted to a narrowband communication environment, there is a limitation in transmitting a desired number of pieces of GPS data, and the burden of data transmission is significantly increased.

When a time interval for which the position information is collected is increased or the position information is collected at irregular intervals in order to overcome the above-described drawbacks, correlations between the GPS measurement points become low. Hence, in order to accurately identify the moving path of the moving object, the radio communication terminal should transmit information including a plurality of velocities and a moving direction of the moving object, which are calculated on the basis of GPS data of position information obtained at each of the increased time intervals, in addition to the position information.

Although the amount of data occupied by the position information is somewhat reduced by increasing the time interval for collection, a large amount of data should be allocated to additional information, such as a plurality of velocities and the moving direction, and thus the transmission burden in the narrowband communication environment still exists.

In addition, due to the position information occupying a large amount of data, a large portion of memory is occupied when a great amount of position information is stored in the radio communication terminal, the server, or the client, thereby causing a heavy burden on a device.

SUMMARY OF THE INVENTION

One objective of the present invention is to provide a method of compressing global positioning system (GPS) data, a method of restoring the GPS data, and a GPS device, which allow a large amount of GPS data compressed as a small amount of data using a lossless GPS data compression method to be efficiently transmitted simultaneously to an external device even in a communication environment of a narrowband network and reduce a memory burden when data is stored.

The objective of the present invention is not limited to that mentioned above, and other objectives not mentioned may be clearly understood by those skilled in the art from the detailed description described hereinafter.

In one general aspect, there is provided a method of compressing GPS data, including: receiving, by a GPS device mounted in a moving object, coordinate values related to source data of GPS information at a sampling rate in accordance with a communication environment in which the GPS device communicates with an external device with a predetermined band; allocating a data capacity that matches a maximum value of displacement according to a difference which can occur between coordinate values in the moving object; calculating a displacement value between corresponding coordinate values at each time interval of the sampling rate; and generating displacement data by encoding each displacement value according to the data capacity and storing the displacement data in a predetermined device.

The generating and storing of the displacement data may include storing multiple displacement data in units of a predetermined number of displacement data in displacement data set in accordance with at least one of the communication environment and a request of the external device.

The method may further include, subsequent to the generating and storing of the displacement data, generating a stream in a file format which includes a header including the sampling rate, the number of displacement data in the displacement data set, and information related to the data capacity, a reference data field including a predetermined initial reference time and reference coordinate values, and a displacement data field composed of a set of displacement data combined in a time series according to the number of displacement data in the displacement data set; and transmitting the stream to another device through a network of the communication environment.

The displacement data constituting the displacement data field may be excluded from a displacement data sequence when the displacement value is 0, different information may be written in the file format according to whether the displacement value is 0, and the file format may further include a bit mask field in which index data corresponding to the number in the displacement data set are arranged in a time-series manner at a front end of the displacement data field.

The method may further include, subsequent to the generating and storing of the displacement data, generating a stream in a file format which includes a header including the sampling rate and information related to the data capacity, a reference data field including a predetermined initial reference time and reference coordinate values, and a displacement data field composed of at least one displacement data; and transmitting the stream to another device through a network of the communication environment.

The generating and storing of the displacement data may include storing the displacement data as hexadecimal (HEX) data and recording a sign bit for indicating information related to a positive or negative difference of the displacement value in the displacement data.

The allocating of the data capacity may include setting the data capacity in advance on the basis of the moving object in which the GPS device is mounted or dynamically setting the data capacity on the basis of a difference between the plurality of coordinate values which are received by the GPS device according to movement of the moving object.

In another general aspect, there is provided a method of restoring GPS data, which is implemented by an external device, the method including: providing a stream in a file format which includes a header including a sampling rate in accordance with a communication environment for communication with the external device with a predetermined band and information related to a data capacity that matches a maximum value of displacement according to a difference which can occur between coordinate values in a moving object in which a GPS device is mounted, a reference data field including a predetermined initial reference time and reference coordinate values, and a displacement data field composed of at least one displacement data generated by encoding each displacement value between corresponding coordinate values at each time interval of the sampling rate; and restoring the coordinate values corresponding to a moving path of the moving object in connection with GPS source data on the basis of the sampling rate, the information related to the data capacity, the reference time, the reference coordinate values, and the displacement data.

The method may further include, subsequent to restoring the coordinate values, calculating a velocity, a moving direction, and a moving path of the moving object by referring to the coordinate values and the sampling rate.

In still another general aspect, there is provided a GPS device including: a sampler configured to receive coordinate values related to source data of GPS information at a sampling rate in accordance with a communication environment in which the GPS device mounted in a moving object communicates with an external device with a predetermined band; and a calculation storage configured to calculate a displacement value of corresponding coordinate values at each time interval of the sampling rate, generate displacement data by encoding each displacement value between corresponding coordinate values at each time interval of the sampling rate according to a allocated data capacity which matches a maximum value of displacement that is set in accordance with a difference which can occur between coordinate values in the moving object, and store the displacement data in a predetermined device.

Details of other embodiments are included in the detailed description and drawings of the present invention.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a configuration diagram illustrating a system for transmitting global positioning system (GPS) data which includes a GPS device according to one embodiment of the present invention;

FIG. 2 is a configuration diagram illustrating a controller;

FIG. 3 is a configuration diagram illustrating a client;

FIG. 4 is a flowchart illustrating a method of compressing GPS data according to another embodiment of the present invention;

FIG. 5 is a diagram illustrating examples of measurement time and latitude and longitude coordinate values which are extracted from source data of GPS information;

FIG. 6 is a diagram illustrating an example of a table to be applied to a process of allocating data capacity that matches a maximum value of displacement.

FIG. 7 is a diagram illustrating an example of displacement data generated by encoding a displacement value on the basis of the data capacity;

FIG. 8 is a flowchart illustrating a process of generating a file format of a stream to be transmitted to an external device in a method of compressing GPS data according to another embodiment of the present invention;

FIG. 9 is a diagram illustrating an example of a file format of a stream; and

FIG. 10 is a flowchart illustrating a method of restoring GPS data according to still another embodiment of the present invention.

DETAILED DESCRIPTION OF EXEMPLARY EMBODIMENTS

Hereinafter, the present invention will be described more fully with reference to the accompanying drawings, in which example embodiments of the present invention are shown. The present invention may, however, be embodied in many different forms and should not be construed as necessarily being limited to the example embodiments disclosed herein. Rather, the example embodiments are provided so that the present invention is thorough and complete and fully conveys the concepts of the present invention to those skilled in the relevant art. Like numbers refer to like elements throughout the drawings and the detailed description. The terminology used herein is for the purpose of describing particular embodiments only and is not intended to be limiting to the invention. As used herein, the singular forms "a", "an," and "the" are intended to include the plural forms as well, unless the context clearly indicates otherwise. It will be further understood that the terms "comprises" and/or "comprising," when used in this specification specify the presence of stated features, integers, steps, operations, elements, and/or components, but do not preclude the presence or addition of one or more other features, integers, steps, operations, elements, components, and/or groups thereof.

In addition, the term "units" or "modules" generally means software (computer program) or hardware components which can be logically separated from one another. Accordingly, the module in the exemplary embodiments is not only a module of a computer program, but also a module of a hardware structure. Therefore, the exemplary embodiments will also be described in the form of a computer program for allowing a computer to function as those modules (a program for causing a computer to execute program steps, a program for allowing a computer to function as corresponding means, a computer program for allowing a computer to implement corresponding functions), a system, and a method. While expressions such as "store," "storing," "being stored," and equivalents thereof are used for the sake of description, such expressions indicate, when the exemplary embodiments relate to a computer program, storing the computer program in a storage device or performing control so that the computer program is stored in a storage device. Modules may correspond to functions in a one-to-one relationship. In terms of implementation, however, one module may be composed of one program, or plural modules may be composed of one program. Alternatively, one module may be composed of plural programs. Additionally, plural modules may be executed using a single computer, or one module may be executed using plural computers in a distributed or parallel environment. One module may incorporate another module therein. Hereinafter, the term "connection" does not mean only physical connection, but also logical connection (sending and receiving of data, giving instructions, reference relationship among data elements, etc.). The term "predetermined" means having been determined prior to a certain operation, also means having been determined prior to a certain operation before starting processing of the exemplary embodiments, and further means having been determined prior to a certain operation even after starting processing of the exemplary embodiments, in accordance with the current situation/state or in accordance with the previous situation/state.

A system or an apparatus may be realized by connecting a plurality of computers, hardware units, devices, etc. to one another via a communication medium, such as a network (including communication based on a one-on-one correspondence), or may be realized by a single computer, hardware unit, device, etc. The terms "apparatus" and "system" are used synonymously. The term "system" does not include merely a man-made social "mechanism" (social system).

Additionally, for each operation performed by a corresponding unit or module or for each operation of a plurality of operations performed by a corresponding unit or module, target information is read from a storage device, and after performing the operation, a processed result is written into the storage device. Accordingly, reading from the storage device before an operation or writing into the storage device after an operation may not be described. Examples of the storage device may include a hard disk, a random access memory (RAM), an external storage medium, a storage device using a communication circuit, a register in a central processing unit (CPU), etc.

Hereinafter, a global positioning system (GPS) device according to one embodiment of the present invention which constitutes a system for transmitting GPS data will be described in detail with reference to FIGS. 1 to 3. FIG. 1 is a configuration diagram illustrating a system for transmitting GPS data which includes a GPS device according to one embodiment of the present invention, FIG. 2 is a configuration diagram illustrating a controller, and FIG. 3 is a configuration diagram illustrating a client.

The system for transmitting GPS data is mounted in a moving object and may include a GPS device 100 configured to receive source data of GPS information from a GPS satellite 500 and convert the received source data, a server 200 configured to receive the converted source data from the GPS device 100 through a network 400 consisting of a communication environment of a predetermined band, and a client 300 configured to receive the converted source data from the server 200.

The moving object may be a walking human, a vehicle, a ship, an aircraft, or the like, and the GPS device 100 may be carried or mounted in the moving object. The GPS device 100 may be a terminal capable of communicating with an external terminal, may transmit and receive information related to GPS source data as well as various forms of information, and may be, for example, a cellular phone, a smartphone, a tablet computer, a laptop computer, or a navigation system.

The source data of the GPS information is represented according to a GPS data format, for example, National Marine Electronics Association (NMEA)-0183 format, whereby the GPS data format may include a reception time, latitude coordinates values, longitude coordinates values, and other additional information.

The communication environment of the network 400 may support communication with one bandwidth in various bands. The communication environment, which is, for example, a long term evolution (LTE) network, a LTE-machine (LTE-m) network, or a low-power long range wireless communication network usable to apply the Internet-of-Thing (IoT) to a moving object, may be a long range (LoRa) network having a transmission bandwidth narrower than that of an LTE network or a narrowband Internet of Things (NBIoT). In addition, the communication environment may be a $5^{th}$ generation (5G) network having a transmission bandwidth wider than that of the LTE network and may have a bandwidth used for self-driving vehicles or connected cars.

The server 200 may be one of external devices, may be server of a communication provider to which a user of the GPS device 100 transceiving various types of informations, or a specific-purpose server communicating with the GPS device 100 including a navigation system, and may transmit converted information related to the GPS source data to the client 300 intact or transmit a result of analyzing and processing the converted information to the client 300.

The client 300 is one of external devices may calculate the moving path of the moving object using the converted source data and perform the predetermined process or a location-based service system on the basis of the calculation in order to proceed with a predetermined process and analyze the converted information related to the GPS source data received from the server 200. In FIG. 1, the converted information related to the GPS source data may be transmitted to the client 300 via the server 200, but the converted information may be transmitted directly to the client 300 through the network 400 without passing through the server 200.

Referring to FIG. 2, the GPS device 100 includes a GPS receiver 110 configured to receive source data of GPS information at predetermined time intervals, a sampler 120 configured to extract and collect measurement times and latitude and longitude coordinate values from a plurality of received source data respectively and a calculation storage 130 configured to encode a displacement value between the coordinate values with lossless compression and store the displacement value as displacement data.

In addition, the GPS device 100 may include a controller 140, which controls data processing performed by the sampler 120 and the calculation storage 130 according to the band of the communication environment and a type of object related to the moving object and generates a stream in a predetermined file format having a displacement data sequence etc., and a transmitter 150 including a radio antenna module or the like for transmitting the stream to the server 200, which is an external device.

The GPS receiver 110 may receive source data represented in a GPS data format such as NMEA-1803 format.

The sampler 120 may extract the measurement times and latitude and longitude coordinate values from the information of source data at a sampling rate determined by a transmission bandwidth of the communication environment notified from the controller 140. The sampling rate may be greater than or equal to the time interval for which the GPS receiver 110 receives the source data by referring to the transmission bandwidth of the communication environment.

The calculation storage 130 calculates a displacement value of corresponding coordinate values at each time interval of the sampling rate, generates displacement data by encoding each displacement value between corresponding coordinate values according to a data capacity which is allocated by the controller 140 to match a maximum value of displacement which can occur in the moving object and is set according to a difference between coordinate values and stores the displacement data. In this case, the device in which the displacement data is stored may be preset as the GPS device 110 or an external device.

The controller 140 controls data processing performed in the sampler 120 and the calculation storage 130 and generates a stream of displacement data in a predetermined file format, and more specifically, may include a header/reference data generation module 141, a filter coder module 142, a coding control module 143, a merge module 144, and a transmission protocol module 145 as shown in FIG. 2.

The header/reference data generation module 141 may generate a header of a stream on the basis of the sampling rate transmitted from the coding control module 143, the number of displacement data in the displacement data set (refer to FIG. 9), the data capacity and form the header of a stream and reference data from the initial measurement time of source data and initial latitude and longitude coordinates transmitted from the calculation storage 130. When the reference data and one piece of displacement data are transmitted to an external device according to the communication environment and a request from the server 200 and/or the client 300, information related to the number in the displacement data set is excluded from a header unlike the above-described embodiment.

The filter coder module 142 is controlled by the coding control module 143. The filter coder module 142 may write pieces of index data, which are different from each other, subsequently in a bit mask field (refer to FIG. 9) of a stream according to whether a displacement value is 0, and when a displacement value is 0, may not allocate the number of bits to a corresponding displacement data such that the displacement data is excluded from the displacement data sequence and may merge displacement data in which displacement value is not 0 in a time-series manner.

The coding control module 143 sets a sampling rate of source data by referring to the predetermined band of the communication environment and determines data capacity matching the maximum value of displacement based on a difference which can occur between coordinate values in the moving object according to the type of the moving device, i.e., of an object, in which the GPS device 100 is carried or mounted. In addition, the coding control module 143 may determine the number of pieces of displacement data belonging to a displacement data field according to at least one of the band of the communication environment and a request from the server 200 and/or the client 300. The coding control module 143 may notify the sampler 120, the calculation storage 130, the header/reference data generation module 141, the filter coder module 142, and the merge module 144 of the sampling rate, the data capacity, and the number of the displacement data in the displacement data set, thereby controlling the processing thereof.

The merge module 144 may generate a stream in a file format shown in FIG. 9 by combining index data corresponding to the number of piece of displacement data generated by the filter coder module 142 and the displacement data, in which a displacement value is not 0, together with the header and the reference data field generated by the header/reference data generation module 141.

The transmission protocol module 145 encodes or multiplexes the stream so as to comply with a protocol of the communication environment.

Meanwhile, in the present embodiment, a process of generating and storing displacement data by receiving coordinate values related to the GPS source data and encoding a displacement value according to the data capacity that matches the maximum value of displacement is implemented in the GPS device 100. In addition, in the present embodiment, a process of generating a stream in a file format including the displacement data is performed in the GPS device 100.

However, the process of receiving the GPS source data or coordinate values related to the source data may be performed in the GPS device 100 and the process of generating and storing the displacement data by receiving the source data or the coordinate values from the GPS device 100 and encoding the displacement value according to the data capacity may be performed in the external device, for example, the server 200, the client 300, or devices for distribution processing. According to an embodiment in which the displacement data is generated and stored in the external device, in a case where the network 400 has a wide transmission bandwidth, even when the GPS source data or coordinate values having a rather large amount of data is transmitted to the external device, a memory burden on the external device in which the GPS related data is stored is significantly reduced, while a transmission load is not increased.

The process of generating the stream including the displacement data may also be implemented in the external device, for example, the server 200, the client 300, or the devices for distribution processing. Accordingly, the calculation storage 130 and the modules 141 to 145 that constitute the controller 140 may be implemented in the external device, and in the case where the external device receives the source data and receives and extracts coordinate values at a sampling rate, the external device may further include the sampler 120.

Meanwhile, referring to FIG. 3, the client 300 may include a receiver 310 configured to receive a stream in a file format shown in FIG. 9, a separator 320 configured to separate a header and a reference data field from an index data sequence and a displacement data sequence in the stream and to analyze the header and the reference data, and an inverse filter 330 configured to convert displacement data into a form of a restored set by referring to the index data and the number in the displacement data set. When the number of the displacement data in the displacement data set is 1, the displacement data is converted into a single data structure, rather than in set form.

In addition, the client 300 may include a source data restorer 340 configured to restore the coordinate values of the source data on the basis of the reference data, the sampling rate and the restored displacement data and a calculator 350 configured to calculate the velocity, the moving direction, and the moving path of the moving object by referring to a reference time, reference latitude and longitude coordinate values, a sampling rate and the restored coordinate values.

Hereinafter, a process of implementing a compression process of coordinate values related to source data of the GPS information in the GPS device 100 will be described with reference to FIGS. 1 to 7.

FIG. 4 is a flowchart illustrating a method of compressing GPS data according to another embodiment of the present invention, and FIG. 5 is a diagram illustrating examples of measurement time and latitude and longitude coordinate values which are extracted from the source data of the GPS information. FIG. 6 is a diagram illustrating an example of a table to be applied to a process of allocating data capacity that matches a maximum value of displacement, and FIG. 7 is a diagram illustrating an example of displacement data generated by encoding a displacement value on the basis of the data capacity.

Referring to FIG. 4, the GPS receiver 110 of the GPS device 100 mounted in a moving object collects source data of GPS information at predetermined time intervals, and the sampler 120 receives coordinate values related to the source data at a sampling rate determined by a transmission bandwidth of a communication environment notified from the coding control module 143 (S410).

The source data of the GPS information is represented according to a GPS data format, for example, NMEA-0183 format, whereby the GPS data format may include a reception time, latitude coordinates values, longitude coordinates values, and other additional information.

As shown in FIG. 5, the sampler 120 may extract the measurement time and the latitude and longitude coordinate values from the source data and receive the coordinate values at a sampling rate.

Here, the coding control module 143 may determine the sampling rate to be greater than or equal to a time interval for which the GPS receiver 110 receives the source data by referring to the transmission bandwidth of the communication environment and may transmit the determined sampling rate to the sampler 120. FIG. 4 illustrates a case in which the coordinate values are extracted and received at a sampling rate that is the same as the time interval for receiving the source data.

In addition, the GPS receiver 110 may receive the source data regardless of the movement of the moving object, while the sampler 120 under the control of the controller 140 may be triggered to receive and collect the coordinate values at the sampling rate only when a movement detection sensor (not shown) detects movement of the moving object. Accordingly, it is possible to reduce operation power and memory occupancy of the GPS device 100.

Then, the coding control module 143 sets a maximum value of displacement according to a difference which can occur between coordinate values in the moving object (S420).

By taking as an example of a table shown on the left side of FIG. 6, which presents maximum values of displacement according to latitudes or longitudes, a maximum moving distance (a distance moved) and maximum speed for one interval of a sampling rate are preset for each object type of the moving object (i.e., from slow to fast means of transport), such as walking of a person, a bicycle, a vehicle traveling specific road, an aircraft, and the like.

When the sampling rate is set to 1 second, a distance per second corresponding to the maximum speed of the object type and a coordinate displacement (coordinate values are expressed in degrees, minutes, and seconds and are illustrated in units of 1/100 seconds as the unit of coordinate seconds in FIG. 6) expressed in units of latitude or longitude coordinate value are calculated. The distance per second and/or a distance per coordinate is utilized as a maximum value of displacement between sampling rates for each object type.

Referring to the table on the left side of FIG. 6, the maximum value of displacement is set to increase as the maximum expected speed of the object type becomes greater.

Subsequently, the coding control module 143 checks the current moving object in which the GPS device 100 is carried or mounted, allocates data capacity of the displacement matching the maximum displacement value corresponding to the object type of the current moving object, and transmits the data capacity to the calculation storage (S430).

Referring to FIG. 6 as an example, when the current moving object in which the GPS device 100 is mounted is an aircraft, the coding control module 143 identifies the object type shown in the table on the left side of FIG. 6 as an aircraft and allocates 9 bits to the data capacity in order to express a distance per second and/or a coordinate displacement corresponding to maximum values of displacement which can occur between latitude coordinate values and longitude coordinate values at a sampling rate of the aircraft as displacement data. As can be seen in a right-side table in FIG. 6, since up to 512 states need to be secured for each of the latitude and longitude displacements in order to represent digital data from a displacement value of 0 to maximum latitude and longitude displacement values which may be expected for an object type, the number of bits of displacement data to be allocated is set to increase in accordance with the above-described state. In FIG. 6, the reason why the data capacity of each of longitude and latitude for an aircraft is set to 10 bits will be described below, and the data capacity of each of the longitude and latitude corresponding to the object type is set to 10 bits by further including 1 bit for representing a positive or negative displacement value.

Allocation of the data capacity may be set in advance on the basis of the moving object in which the GPS device 100 is mounted and may be input to the coding control module 143. Alternatively, in order to improve convenience, the allocation of the data capacity may be dynamically determined on the basis of a difference between a plurality of coordinate values received by the GPS receiver 110 of the GPS device 100 as the moving object moves.

Next, the coding control module 143 may set the number of the displacement data in the displacement data set for processing a plurality of displacement data in units of one set according to at least one of the band of the communication environment and a request of the server 200 and/or the client 300 (S440). The present embodiment exemplifies configuration of a unit for transmitting a plurality of displacement data to an external device as a set, but one piece of displacement data may be transmitted together with the reference time and the reference latitude and longitude coordinate values according to the request of the client 300.

Subsequently, the calculation storage 130 calculates a displacement value between coordinate values corresponding to each time interval of the sampling rate (S450).

By taking FIG. 7 as an example, the calculation storage 130 calculates a latitude displacement value between the latitude coordinate values and a longitude displacement value between the longitude coordinate values at each time interval of the sampling rate, wherein the latitude and longitude coordinate values are collected by the sampler 120. Specifically, in FIG. 7, the latitude and longitude displacement values at 1:45:00 on Sep. 23, 2017, which is the first line of the table, may be employed as reference data by the coding control module 143. Latitude and longitude displacement values between the reference data and the latitude coordinate value of the second line and between the reference data and the longitude coordinate value of the second line are obtained, and in the same manner, displacement values between latitude values of the $n^{th}$ line and the $(n+1)^{th}$ line and between longitude values of the $n^{th}$ line and the $(n+1)^{th}$ line are sequentially calculated and tabulated in time series. In FIG. 7, the latitude and longitude coordinate values are expressed in degrees, minutes, and seconds, and in the case in which the sampling rate is set to 1 second, a displacement value is expressed in units of $1/100$ seconds.

Then, the calculation storage 130 generates each piece of displacement data by encoding each displacement value according to the notified data capacity from the coding control module 143 (S460).

Referring to FIG. 7 as a example, since the object type is an aircraft, 10 bits are allocated as the data capacity for each of the latitude and longitude displacements (refer to FIG. 6). A displacement between coordinate values of the $n^{th}$ and $(n+1)^{th}$ lines is lossless compressed and encoded in the range of the allocated 10 bits. The encoded latitude and longitude displacement data may be represented as ASCII code and may be stored as hexadecimal (HEX) data, as shown in FIG. 7, in order to increase a compression rate.

In addition, displacement data may be generated by further including a sign bit for indicating a sign of each displacement data related to a latitude and a longitude in order to represent information related to a positive or negative difference between displacement values and the sign bit may be arranged in the leftmost position of the ASCII code shown in FIG. 7.

Then, the calculation storage 130 stores, in a predetermined device, a plurality of displacement data in units of the displacement data set having a predetermined number of the displacement data configured by the coding control module 143 (S470).

In FIG. 7, the calculation storage 130 deletes measurement time and coordinate values of other lines, except for the reference data including the measurement time and latitude and longitude coordinate values of the first line and keeps only the displacement data of all the lines following the first line.

In addition, the calculation storage 130 stores the reference data and the displacement data in units of the predetermined number in displacement data set so as to be suitable for the subsequent process of transmission to the external device. In this case, the predetermined device in which the displacement data is stored may be the GPS device 100, and the external device which receives the displacement data may be the server 200 or the client 300.

The advantages according to the present invention related to the above-described embodiment will be described by taking an example of an aircraft, which is an object type to which the largest data capacity is allocated.

Specifically, in a case in which a sampling rate is set to 1 second and coordinate values are received for 1 minute, that is, 60 coordinate values are received as shown in FIG. 5, a conventional art and the present invention are compared.

According to the conventional art, regardless of ASCII or HEX code conversion, all 60 measurement times and 60 latitude and longitude coordinate values should be converted into codes, and in ASCII code, 1860 bytes corresponding to 31 bytes (refer to Background)×60 are required, and in HEX conversion, at least 720 bytes, which are 12 bytes (refer to Background)×60, should be allocated.

However, in the present invention, in the case in which an object type is an aircraft, HEX conversion is performed on the measurement time and the latitude and longitude coordinate values of the first line of FIG. 6, which is the reference data, such that 12 bytes are allocated, and only the displacement data of the latitude and longitude coordinate values of the lines following the first line are lossless compressed and stored. Hence, when 60 coordinate value-related data are stored, 12 bytes+2×10 bits (data capacity allocated to displacement data of a latitude or a longitude)×59 (the number of displacement data, except for the reference data, in 60 displacement data in displacement data set)/8 (1 byte=8 bit) is obtained.

Accordingly, since about 160 bytes are required, about 8.6% of memory capacity is required compared to the conventional ASCII code and storage space is reduced about 91.4%. In addition, only about 22.2% of memory is occupied compared to HEX conversion and storage space is reduced about 78%.

In the above description, an object type of an aircraft that requires a large data capacity has been described. However, in the case in which an object type is walking, a vehicle, or the like, the allocated data capacity is further reduced so that a much smaller storage space is required compared to the conventional art.

According to the present invention, a large amount of GPS data is stored as lossless compressed displacement data so that the amount of memory occupied is drastically reduced and the burden of memory is significantly relieves. This is a great advantage only when data is compressed and stored in the GPS device 100 but also when data is processed and stored in an external device of the server 200 or the client 300 in a lossless compressed form. For example, when the moving path of the moving object in which the GPS device 100 is mounted is identified by directly connecting the moving object and a device, the present invention can store a larger amount of GPS data compared to the conventional art and identify a history of movement for a long period of time.

In addition, the displacement data is generated by lossless compressing a displacement between coordinate values, which contributes to lossless restoration of original coordinate values of the data following the reference data within a short period of time without complicated inverse conversion.

Meanwhile, in the above embodiment, a plurality of displacement data are stored corresponding to the predetermined number of the displacement data designated from the displacement data set. However, one piece of displacement data may be stored as a unit according to a band of the communication environment and requests of the server 200 and the client 300.

In addition, in the above embodiment, the GPS data are lossless compressed and processed in the GPS device 100, but that the external device, for example, the server 200 or the client 300 may perform the significantly same processing as described above is not excluded. The server 200 and the client 300 may distribute the functions and processes of FIGS. 1, 2 and 4 to 7.

Specifically, the operation S410 of receiving the GPS source data or coordinate values related to the source data may be performed in the GPS device 100 and the operations S420 to S470 of receiving the source data or the coordinate values from the GPS device 100 and generating and storing the displacement data by encoding a displacement value according to the data capacity may be performed in the external devices, for example, the server 200, the client 300, and devices for distribution processing. In this case, the calculation storage 140 and the modules for performing the above-described operations in the controller 140 may be implemented in the external device, and in the case in which the external device receives the source data and extracts the coordinate values at a sampling rate, the external device may further include the sampler 120 to perform a part of the operation S410.

According to the embodiment in which the external device generates and stores the displacement data, in a case in which the network 400 has a wide transmission bandwidth, even when the GPS source data or the coordinate value, which has rather a large amount of data, is transmitted to the external device, a memory burden on the external device, in which the GPS related data is stored, is significantly reduced, while a transmission load is not increased.

Hereinafter, a process of the GPS device 100 for generating a file format of a stream including displacement data related to GPS source data and transmitting the stream to the external device will be described with reference to FIGS. 1, 2, 8, and 9.

FIG. 8 is a flowchart illustrating a process of generating a file format of a stream to be transmitted to an external device in a method of compressing GPS data according to another embodiment of the present invention, and FIG. 9 is a diagram illustrating an example of a file format of a stream.

Referring to FIG. 8, the header/reference data generation module 141 generates a header including a sampling rate notified from the coding control module 143, the number of the displacemenat data in displacement data set, and data capacity related information, as shown in FIG. 9 (S810).

In FIG. 9, the data capacity related information is represented as the number of bits, which is a data capacity, but in another embodiment, it may be represented as an object type and the data capacity may be identified in the course of analyzing the external device.

In addition to the generation of the header, the header/reference data generation module 141 employs reference data consisting of a reference measurement time and reference latitude and longitude, which are respectively a measurement time and latitude and longitude coordinate values of the first line of the table in FIG. 7 stored in the calculation storage 130, and generates and stores a reference data field according to the reference data. Here, the reference latitude and longitude coordinate values may be converted to include a decimal point as shown in FIG. 7, and, alternatively, in order to avoid the formation of a decimal number, in consideration of the communication environment in which digits past a predetermined point are likely to be read as errors, a value obtained by multiplying a decimal number truncated to m decimal places by $10^m$ is converted and is written in a reference data field.

Thereafter, the filter coder module 142 under the control of the coding control module 143 creates index data for recording different information according to whether a displacement value is 0 and excludes the corresponding displacement data (S820).

Specifically, when the latitude and longitude coordinate values or the displacement data is 0 in the table of FIG. 7, the filter coder module 142 represents the index data as 0, and otherwise, represents the index value as 1. Further, the filter coder module 142 generates and arranges index data in the sampled time-series order of FIG. 7.

In addition, the filter coder module 142 processes displacement data corresponding to the index data represented as 0, that is, displacement data having a displacement value of 0, to be excluded in the process of generating a stream shown in FIG. 9.

Then, the merge module 144 sequentially merges the header, the reference data, and a bit mask field consisting of a sequence of a number of index data corresponding to the number of the displacement data in the displacement data set determined by the coding control module 143 and combines displacement data, which time-serially corresponds to the index data represented as 1 and has a displacement value which is not 0, at the end of the merged data in the sampled time series order (S830).

As a result, the merge module 144 generates a stream in a file format including the header, the reference data field, the bit mask field, and a displacement data field in which the displacement data sequence is arranged, as shown in FIG. 9.

Then, the transmission protocol module 145 encodes or multiplexes the stream to comply with the protocol of the communication environment, and the transmitter 150 transmits the stream processed by encoding or the like to the server 200 or the like (S840).

According to the present embodiment, since a method of lossless compression of GPS data is used, it is possible to efficiently transmit a large amount of GPS data simultaneously to the external device through a small amount of data even in a communication environment, such as a narrowband network.

In addition, by excluding the displacement data in which a displacement value is 0 from the stream, the number of transmitted bits of the stream is further reduced, thereby substantially increasing a transmission bit rate.

Meanwhile, although in the present embodiment, an example, in which the displacement data set having a plurality of displacement data is transmitted, is described, in a case in which one piece of displacement data is transmitted together with the reference data, the configuration of the file format shown in FIG. 9 may be partially changed. For example, the stream in the file format in which information on the number in the displacement data set is removed from the header of FIG. 9, the bit mask field is excluded, and information of 0 is included in the displacement data field even when the displacement data is 0 is transmitted.

In addition, in the above-described embodiment, it is described that the GPS device 100 generates and transmits the stream to the server 200 or the like, which is an external device. However, that the external device, for example, the server 200 or the client 300, performs the substantially the same processing as described above and transmits a processed result to the other device that does not perform the processing is not excluded. The other device may be at least one of, for example, a server or a client that does not perform the processing. The other device may store displacement data through the procedures of FIGS. 4 to 7 and then perform the procedures of FIG. 8 on the displacement data.

Accordingly, the calculation storage 130 and the modules 141 to 145 constituting the controller 140 may be implemented in the external device and when the external device receives source data and extracts coordinate values at a sampling rate, the external device may further include the sampler 120.

Hereinafter, a process of implementing a method of restoring GPS data in the client 300 according to still another embodiment of the present invention will be described with reference to FIGS. 1, 3, 9, and 10.

FIG. 10 is a flowchart illustrating a method of restoring GPS data according to still another embodiment of the present invention.

Referring to FIG. 10, the receiver 310 of the client 300 receives a stream in a file format shown in FIG. 9 which consists of a header, a reference data field, a bit mask field, and a displacement data field (S1010).

Then, the separator 320 separates the header and the reference data field from an index data sequence and a displacement data sequence in the stream of FIG. 9 and analyzes the header and reference data (S1020).

A sampling rate and information related to the data capacity allocated to a displacement value, which are extracted as a result of analysis, may be provided to the source data restorer 340 that performs restoration of coordinate values, and the number in the displacement data set may be provided to the inverse filter 330. The information related to the data capacity may be the number of bits or may be an object type related to a moving object.

Subsequently, the inverse filter 330 converts displacement data into a restored set of displacement data even including displacement data in which a displacement value is 0 by referring to index data of the bit mask field and the number in the displacement data set analyzed by the separator 320 (S1030).

Specifically, the inverse filter 330 converts the displacement data combined into a sequence in the stream into a restored set in which latitude and longitude displacement data (HEX or ASCII) are arranged according to a time interval of a sampling rate as shown in FIG. 7.

Then, the source data restorer 340 restores coordinate values of the source data on the basis of a reference time and reference latitude and longitude coordinate values, which are reference data, the sampling rate, and the restored displacement data (S1040).

Accordingly, the measurement times and latitude and longitude coordinate values of the first to third lines of the table in FIG. 7 are completely restored.

Then, the calculator 350 calculates the velocity, the moving direction, and the moving path of the moving object by referring to a reference time, reference latitude and longitude coordinate values, a sampling rate, and the restored coordinate values.

According to the present embodiment, by receiving and restoring the GPS data processed by a method of lossless compression of a displacement value, even a client subordinate to a narrowband communication environment can receive a large amount of GPS data compressed as a small amount of data. In addition, in the case of the GPS data processed by the lossless compression method, original coordinate values can be lossless restored within a short period of time without a complicated inverse conversion. Further, the present embodiment significantly reduces the memory burden by occupying a remarkably small amount of memory, as compared to the conventional art in which all the coordinate values are converted into ASCII or HEX code.

Meanwhile, in the present embodiment, an example in which displacement data set having a plurality of displacement data is included in a stream is described. However, in an embodiment in which one piece of displacement data is transmitted, a process performed in the inverse filter 330 may be omitted. In addition, an embodiment in which the client 300 performs processing of a process, such as the moving path of the moving object, is described. However, that the server 200 may perform the substantially the same processing as described above and that the server 200 and the client 300 may process the functions and procedures of FIGS. 3 and 10 in a distributed manner is not excluded.

According to the present invention, by using a lossless GPS data compression method, it is possible to efficiently transmit a large amount of GPS data compressed as a small amount of data simultaneously to an external device even in a communication environment, such as a narrowband network, and alleviate the memory burden when GPS data is stored in the GPS device, the server, and the client.

The components constituting the GPS device 100 and the client 300 shown in FIGS. 1 to 3, or the operations according to the embodiments illustrated in FIGS. 4 to 10 may be recorded in a computer-readable recording medium in the form of a program that realizes a function thereof. The computer-readable recording medium herein may refer to a recording medium in which information including data and programs can be accumulated by an electrical, magnetic, optical, mechanical, or chemical operation and which may be read by a computer. Examples of recording media which may be removed from a computer include portable storages, flexible disks, magnetic-optical disks, compact disc-read-only memories (CD-ROMs), CD-R/W disks, digital video discs (DVDs), digital audiotapes (DATs), memory cards, and the like. In addition, examples of recording media fixed to a mobile device and a computer may include solid state disks (SSDs), hard disks, ROMs.

Also, in the description above, although all of the components of the embodiments of the present invention may have been explained as assembled or operatively connected as a single unit, the present invention is not intended to limit itself to such embodiments. Rather, within the objective scope of the present invention, any number of the respective components may be selectively and operatively combined. Every one of the components may also be implemented by itself in hardware while the respective ones can be combined in part or as a whole selectively and implemented in a computer program having program modules for executing functions of the hardware equivalents.

Although exemplary embodiments of the present invention have been described for illustrative purposes, those skilled in the art will appreciate that various modifications, additions and substitutions are possible without departing from the scope and spirit of the invention. Therefore, exemplary embodiments of the present invention have not been described for limiting purposes. Accordingly, the scope of the disclosure is not to be limited by the above embodiments but by the claims and the equivalents thereof.

REFERENCE NUMERALS

| | |
|---|---|
| 100: GPS DEVICE | 110: GPS COLLECTOR |
| 120: SAMPLER | 130: CALCULATION STORAGE |
| 140: CONTROLLER | 150: TRANSMITTER |
| 200: SERVER | 300: CLIENT |
| 310: RECEIVER | 320: SEPARATOR |
| 330: INVERSE FILTER | 340: SOURCE DATA RESTORER |
| 350: CALCULATOR | 400: NETWORK |
| 500: GPS SATELLITE | |

What is claimed is:

1. A method of compressing global positioning system (GPS) data, comprising:

receiving, by a GPS device mounted in a moving object, coordinate values related to source data of GPS information at a sampling rate in accordance with a communication environment in which the GPS device communicates with an external device with a predetermined band;

allocating a data capacity that matches a maximum value of displacement according to a difference which can occur between coordinate values in the moving object;

calculating a displacement value between corresponding coordinate values at each time interval of the sampling rate; and generating displacement data by encoding each displacement value according to the data capacity and storing the displacement data in a predetermined device.

2. The method of claim 1, wherein the generating and storing of the displacement data includes storing multiple displacement data in units of a predetermined number of displacement data in displacement data set in accordance with at least one of the communication environment and a request of the external device.

3. The method of claim 2, further comprising: subsequent to the generating and storing of the displacement data, generating a stream in a file format including a header including the sampling rate, the number of displacement data in the displacement data set, and information related to the data capacity, a reference data field including a predetermined initial reference time and reference coordinate values, and a displacement data field composed of a set of displacement data combined in a time series according to the number of displacement data in the displacement data set; and transmitting the stream to another device through a network of the communication environment.

4. The method of claim 3, wherein the displacement data constituting the displacement data field is excluded from a displacement data sequence when the displacement value is 0, different information is written in the file format according to whether the displacement value is 0, and the file format further includes a bit mask field in which index data corresponding to the number in displacement data set are arranged in a time-series manner at a front end of the displacement data field.

5. The method of claim 1, further comprising: subsequent to the generating and storing of the displacement data, generating a stream in a file format which includes a header including the sampling rate and information related to the data capacity, a reference data field including a predetermined initial reference time and reference coordinate values, and a displacement data field composed of at least one the displacement data; and transmitting the stream to another device through a network of the communication environment.

6. The method of claim 1, wherein the generating and storing of the displacement data includes storing the displacement data as hexadecimal (HEX) data and recording a sign bit for indicating information related to a positive or negative difference of the displacement value in the displacement data.

7. The method of claim 1, wherein the allocating of the data capacity includes setting the data capacity in advance on the basis of the moving object in which the GPS device is mounted or dynamically setting the data capacity on the basis of a difference between the plurality of coordinate values which are received by the GPS device according to movement of the moving object.

8. A method of restoring global positioning system (GPS) data, which is implemented by an external device, the method comprising:

providing a stream in a file format which includes a header including a sampling rate in accordance with a communication environment for communication with the external device with a predetermined band and information related to a data capacity that matches a maximum value of displacement according to a difference which can occur between coordinate values in a moving object in which a GPS device is mounted, a reference data field including a predetermined initial reference time and reference coordinate values, and a displacement data field composed of at least one of displacement data generated by encoding each displacement value between corresponding coordinate values at each time interval of the sampling rate; and restoring the coordinate values corresponding to a moving path of the moving object in connection with GPS source data on the basis of the sampling rate, the information related to the data capacity, the reference time, the reference coordinate values, and the displacement data.

9. The method of claim 8, further comprising, subsequent to the restoring of the coordinate values, calculating a velocity, a moving direction, and a moving path of the moving object by referring to the coordinate values and the sampling rate.

10. A global positioning system (GPS) device comprising:

a sampler configured to receive coordinate values related to source data of GPS information at a sampling rate in accordance with a communication environment in which the GPS device mounted in a moving object communicates with an external device with a predetermined band; and a calculation storage configured to calculate a displacement value of corresponding coordinate values at each time interval of the sampling rate, generate displacement data by encoding each displacement value between the corresponding coordinate values at each time interval of the sampling rate according to a allocated data capacity which matches a maximum value of displacement in accordance with a difference which can occur between coordinate values of the moving object, and store the displacement data in a predetermined device.

* * * * *